United States Patent [19]

Tanioka

[11] Patent Number: 5,784,264
[45] Date of Patent: Jul. 21, 1998

[54] MCM (MULTI CHIP MODULE) CARRIER WITH EXTERNAL CONNECTION TEMINALS BGA (BALL GRID ARRAY) TYPE MATRIX ARRAY FORM

[75] Inventor: Michinobu Tanioka, Tokyo, Japan

[73] Assignee: NEC Corporation, Tokyo, Japan

[21] Appl. No.: 562,848

[22] Filed: Nov. 27, 1995

[30] Foreign Application Priority Data

Nov. 28, 1994 [JP] Japan ................... 6-292844

[51] Int. Cl.$^6$ .................. H05K 1/11; H05K 1/14
[52] U.S. Cl. .................. 361/803; 361/761; 361/764; 361/777; 361/760
[58] Field of Search ................... 174/52.4, 260, 174/261; 257/690, 692, 777, 697, 693, 700, 723, 724, 738, 737, 786, 686, 678, 778; 361/761–764, 807, 809, 760, 777, 779; 439/68, 74, 69

[56] References Cited

U.S. PATENT DOCUMENTS

| | | | |
|---|---|---|---|
| 4,882,657 | 11/1989 | Braun | 361/791 |
| 5,438,224 | 8/1995 | Papageorge et al. | 257/678 |

FOREIGN PATENT DOCUMENTS

| | | | |
|---|---|---|---|
| 3-22588 | 1/1991 | Japan . | |
| 4-159767 | 6/1992 | Japan . | |
| 4-290258 | 10/1992 | Japan | 257/686 |
| 4-359457 | 12/1992 | Japan . | |
| 5-48001 | 2/1993 | Japan | 257/668 |
| 5-48000 | 11/1995 | Japan | 257/686 |

OTHER PUBLICATIONS

*Electronic Parts and Materials*, vol. 33, No. 5, published by Kogyo–Chosakai Publishing Co. Ltd., May 1994, pp. 37–42.

*Primary Examiner*—Donald Sparks
*Attorney, Agent, or Firm*—Sughrue, Mion, Zinn, Macpeak & Seas, PLLC

[57] ABSTRACT

The MCM carrier having wiring layers on front and back surfaces and internally thereof. The MCM carrier includes first and second IC chips, an MCM board, and a carrier board. The first IC chip is mounted on the front surface of the MCM board and connected to the wiring layers, and the second IC chip is mounted on the back surface of the MCM board and connected to the wiring layers. The MCM board has a plurality of carrier board connection pads at a peripheral portion on the back surface thereof and the carrier board has MCM board connection terminals and external connection terminals in a matrix form. The MCM board and the carrier board are connected with each other through the carrier board connection pads and the MCM board connection terminals. This MCM carrier can be fabricated at high production yield and low cost with the overall structure being significantly scaled down.

11 Claims, 6 Drawing Sheets

MCM (MULTI CHIP MODULE) CARRIER WITH EXTERNAL CONNECTION TEMINALS BGA (BALL GRID ARRAY) TYPE MATRIX ARRAY FORM

BACKGROUND OF THE INVENTION

(1) Field of the Invention

The present invention relates to an MCM (Multi Chip Module) carrier, and more particularly to an MCM carrier having a carrier board with connection terminals of a BGA (Ball Grid Array) type matrix arrangement.

(2) Description of the Related Art

In order to assist the understanding of the invention, explanations are given first on five prior art examples of conventional MCM carriers of the kinds to which the present invention relates. A first example is one which is shown in FIG. 1 and which is proposed in Japanese Patent Application Kokai Publication No. Hei 3-22588 under the title "PINLESS GRID ARRAY TYPE MULTILAYERED HYBRID INTEGRATED CIRCUIT"; a second example is one which is shown in FIGS. 2A–2C and which is proposed in Japanese Patent Application Kokai Publication No. Hei 4-359457 under the title "SEMICONDUCTOR DEVICE AND MANUFACTURE THEREOF"; a third example is one which is shown in FIG. 3 and which is proposed in Japanese Patent Application Kokai Publication No. Hei 4-159767 under the title "HYBRID INTEGRATED CIRCUIT"; a fourth example is one which is shown in FIG. 4 and which is proposed in "ELECTRONIC PARTS AND MATERIALS" of the issue of May 1994 (pages 39–40) published by Kogyo-Chosakai Publishing Co. Ltd. under the title "BGA TYPE LSI PACKAGE" (FIG. 8(a)); and a fifth example is one which is shown in FIG. 5 and which is proposed also in "ELECTRONIC PARTS AND MATERIALS" of the issue of May 1994 (pages 39–40) published by Kogyo-Chosakai Publishing Co. Ltd. under the title "CHIP SIZE PACKAGE" (FIG. 8(b)).

In the first prior art example shown in FIG. 1, a thin multi-layer board 11 is formed on a thick multi-layer board 10, and a multi-layer hybrid circuit is formed by the wire-bonding 15 of bare chips 2 and the mounting of chip parts 7. The resulting structure is molded using epoxy-resin 16, a plurality of pinless grid pads 13 are formed at the back surface of the thick multi-layer board 10, and a solder bump 14 is provided on a tip of each of pinless grid pads 13. In the drawings, numeral 12 denotes a through-hole. In the second example shown in FIGS. 2A–2C, a printed circuit board 19 has two surfaces provided with wire-bonded bare chips 2 and mounted with chip parts 7 and, underneath the printed circuit board 19, there are provided leads for external connection terminals 4. In the drawings, numeral 17 denotes a small outline package (SOP). In the third example shown in FIG. 3, the structure has chip parts 7 as well with bare chips 2 being mounted on both the surfaces of a thick printed circuit board 10 using a flip chip technique or a wire-bonding technique. In the fourth example shown in FIG. 4, a printed circuit board 19 has a surface mounted with bare chips 2 by a wire-bonding process, and the resulting structure is molded by a protective resin 16. At the back surface thereof, solder balls 4 for the external connection terminals are formed in a matrix form. Lastly, the fifth example shown in FIG. 5 is a chip size package in which a chip carrier having bump terminals in a matrix form is bonded to a peripheral electrode 23 of the bare chip 2. This chip carrier is formed of a polyimide copper flexible board, and elastomer 20 is filled in between the board and the bare chip 2. In the drawings, numeral 3 denotes a carrier board, 21 an aluminum frame, and 22 a Ni/Au plated bump.

With reference to the five prior art MCM carriers described above, the problems that existed and are to be solved are explained below.

In the first prior art example, since the pinless grid pads are formed on the back of the circuit board, which requires all the parts to be mounted on the front surface, and also since the wire-bonding technique is used for the connection of the bare chips, the area of the circuit board inevitably becomes very large especially if the number of parts is large. Therefore, 1) a problem is that the area for mounting on the mother board becomes large, which places restriction to the mounting area that could be used for other electronic parts. Also, since the pinless grid pads are formed on the circuit board of 25.4 mm□ with a pitch of 2.54 mm, if the number of terminals for external leads is increased, the area of the circuit board becomes large accordingly. If the pitch of the pinless grid pads is narrowed to about 0.8 mm, 2) a problem is that there develops such a defect as a ball short (an electrical short) during the solder bump formation. In this example, since the circuit board was an alumina board and the mother board employed a glass epoxy board, a number of the thermal shock tests (from −45° to 125° C.) revealed that 3) there were often problems in the reliability of connecting portions. In the second prior art example, since the lead frame is used for the connection with the mother board which is provided with through-holes penetrating through to the back surface, 4) a problem is that no parts can be placed at the portions having the through-holes and any wiring must be avoided in these portions, and this becomes an obstacle in enhancing density and integration of circuits. Also, since the terminals for the external connection are positioned underside of the board, if the number of the terminals increases, the same problem as the first mentioned problem arises. In the third prior art example, no terminals for the external connection are provided, the structure is not of a module. Thus, 5) a problem is that the structure is difficult to be repaired when any defects have developed. Also, since the structure is not in a module form, a range of applications is limited, and 6) a problem is that the cost becomes high. In the fourth prior art example, since the pitch of the terminals for the external connection at the back of the board is 1.0 mm–2.54 mm in its standard and also since the wire-bonding technique is used for the bare chip connection, there occur the same problems as the first and the second problems mentioned above. In the fifth conventional example, the object is to make it possible to conduct burn-in testing or measurement evaluation at the bare chip level, and the structure is not of a multi-chip module but is of a single chip. Thus, the problem as in the above 6) inevitably arises.

SUMMERY OF THE INVENTION

An object of the present invention, therefore, is to overcome the problems existing in the prior art, and to provide an MCM carrier having MCM circuit connection terminals of a BGA type matrix form, which can be fabricated at high production yield and low cost with the overall structure being significantly scaled down.

According to one aspect of the invention, there is provided an MCM carrier which is a wiring board having wiring layers on front and back surfaces and internally thereof, the MCM carrier comprising:

at least one first IC chip mounted on the front surface of the wiring board and connected to the wiring layers;

at least one second IC chip mounted on the back surface of the wiring board and connected to the wiring layers;

an MCM board having a plurality of carrier board connection pads at a peripheral portion on the back surface of the wiring board; and a carrier board having MCM board connection terminals and external connection terminals in a matrix form, the MCM board connection terminals being connected to said carrier board connection pads of the MCM board.

BRIEF DESCRIPTION OF THE DRAWINGS

The above and other objects, features and advantages of the present invention will be apparent from the following description of preferred embodiments of the invention explained with reference to the accompanying drawings, in which:

FIG. 2A being a sectional view of the structure, and FIG. 2B being a plan view with a molding resin removed, as seen viewed from the direction indicated by arrow "B" in FIG. 2A, and FIG. 2C being a plan view with the molding resin removed, as seen from the direction indicated by arrow "C" in FIG. 2A;

PREFERRED EMBODIMENTS OF THE INVENTION

Now, preferred embodiments of the invention are explained with reference to the accompanying drawings.

Figure 1:
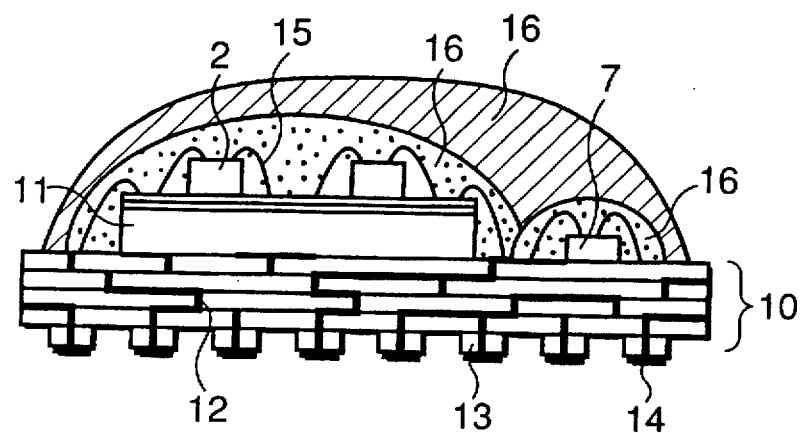
FIG. 1 is a sectional view of a structure of a first prior art example.
Figure 3:
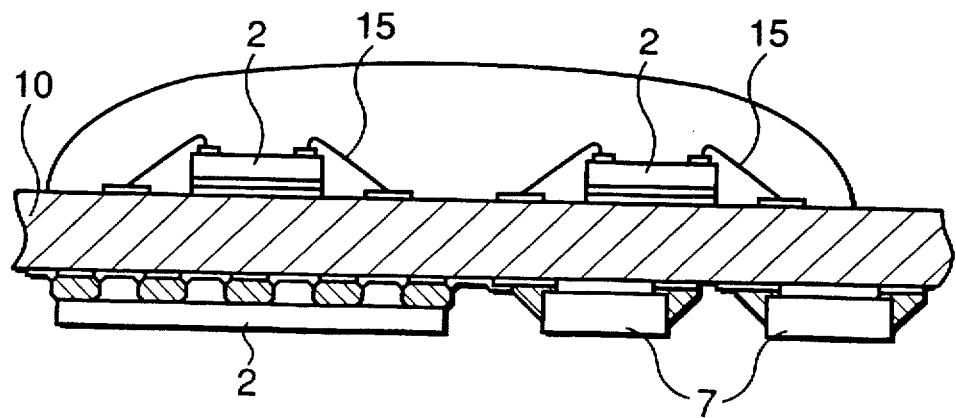
FIG. 3 is a sectional view of a structure of a third prior art example.
Figure 2A:
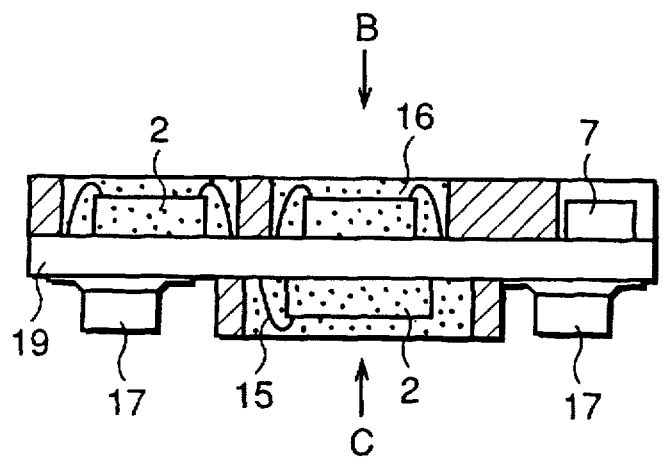
FIGS. 2A, 2B and 2C are diagrams of a sectional view of a structure of a second prior art example.
Figure 2B:
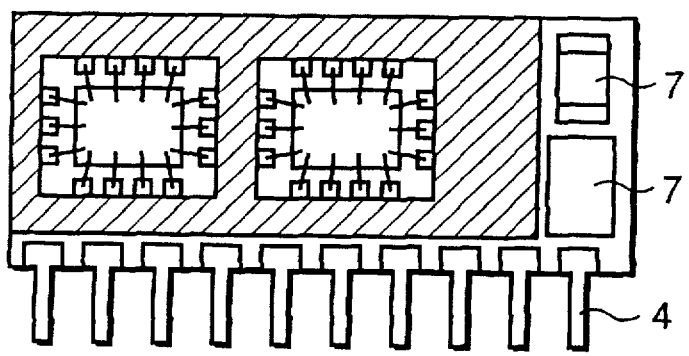
Figure 2C:
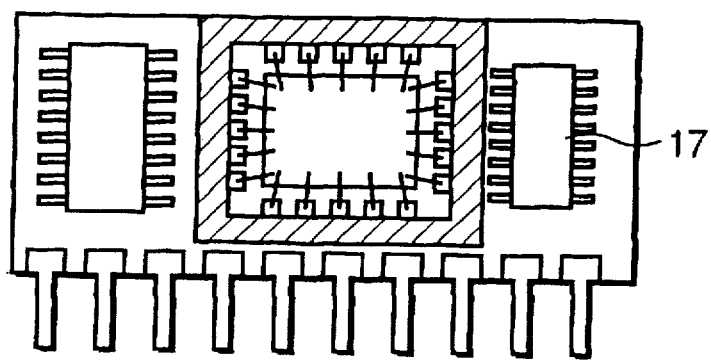
Figure 4:
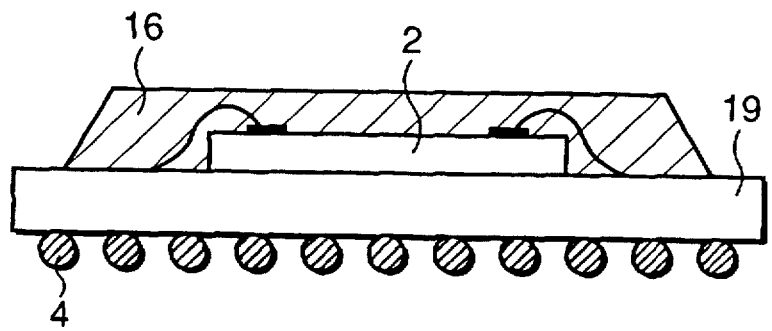
FIG. 4 is a sectional view of a structure of a fourth prior art example.
Figure 5:
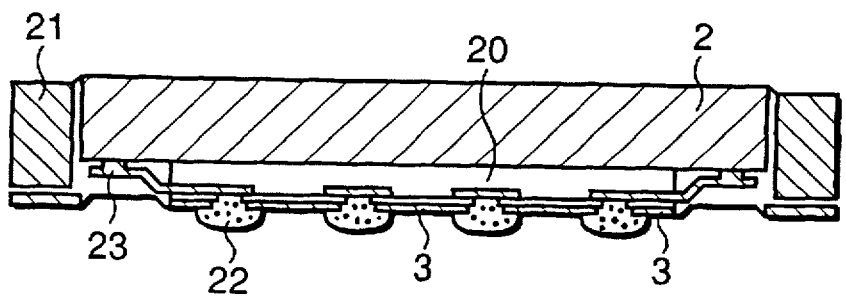
FIG. 5 is a sectional view of a structure of a fifth prior art example.
Figure 6A:
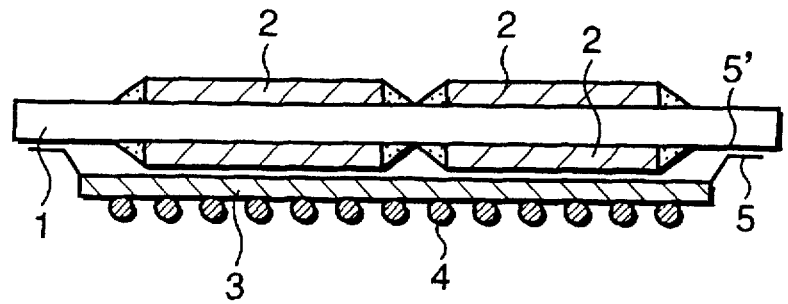
FIGS. 6A and 6B are diagrams of a structure of a first embodiment according to the invention, FIG. 6A being a sectional view of the structure, and FIG. 6B being a bottom view of the structure.
Figure 6B:
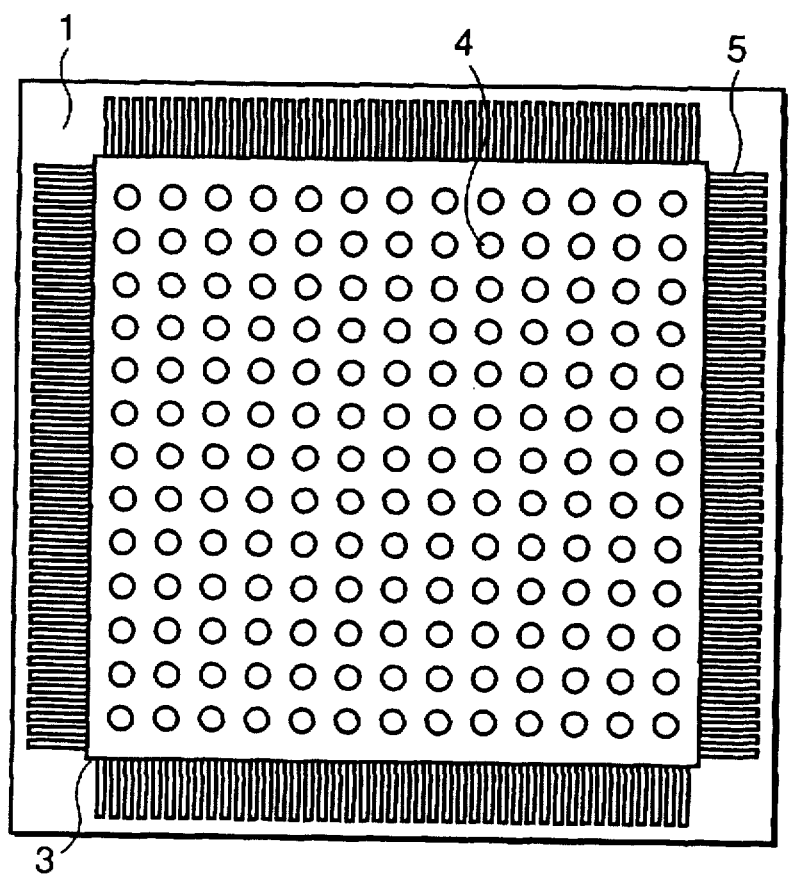

FIGS. 6A and 6B show in a sectional view and in a bottom view respectively a structure of a first embodiment according to the invention. An MCM circuit board (a printed board, an alumina board, a glass-ceramic board, etc.) is provided at its front and back surfaces with pads for connecting bare chips 2. The internal wiring layers of the MCM carrier 1 are shown in FIG. 1, represented in element 10. The pads are connected to the bare chips through bumps (Au, Au/Pd, Cu, Ag/Sn, etc.) (not shown). The methods for connecting them includes a method in which the bumps and the pads of the MCM circuit board 1 are mechanically brought into contact, or a method which utilizes a bonding or an adhesive property of solder (Pb/Sn, In/Sn Ag/Sn, In/Sn/Pb, etc.) or a conductive adhesive agent. Further, in order to enhance the electrical and mechanical connection reliability, resin is filled between the bare chips and the MCM circuit board. Pads for the connection of the carrier board 3 are disposed at the back surface of the MCM circuit board. This carrier board 3 is constituted by a polyimide copper flexible board, in which, for example, the 0.5 mm pitch arrangement of the carrier board connection pads 5' formed at a periphery of the MCM circuit board 1 is changed to a matrix arrangement of a BGA (Ball Grid Array) type so that the external connection terminals 4 have the enlarged pitch of 1.5 mm.

In fabricating the structure, the external connection terminals 4 are attached to the carrier board 3. The attaching process may employ methods in which 1) the pads for the external connection terminals of the carrier board 3 are given cream-solder printing, and a reflow process ($N_2$, Air, IR reflow, etc.) is carried out; 2) the pads for the external connection terminals of the carrier board 3 are given cream-solder printing and, by using a metal mask having holes, the solder balls (metal balls of $\phi 0.5-1.0$ mm with Pb/Sn or solder plated thereon, formed in eutectic Pb/Sn or high temperature Pb/Sn) of predetermined diameters are driven into the locations where the pads for the external connection terminals of the carrier board are located, followed by a reflow process; 3) flux is supplied to the pads for the external connection terminals of the carrier board 3, and the solder balls (eutectic Pb/Sn, high temperature Pb/Sn, metal balls with solder or Pb/Sn being plated thereon, etc.) are driven in, followed by a reflow process; or 4) molten solder kept in a pot having a metal mask with holes at the same positions as the locations of the pads for the external connection terminals of the carrier board is injected using air pressure.

The MCM board connection terminals 5 of the carrier board 3 on which the external connection terminals 4 are formed are made of copper with plating around (Sn, Pb/Sn, Au, etc.), and the connection of these MCM board connection terminals and the MCM board 1 is made using methods such as 1) a gang bonding or a single point bonding using a thermal compression method, and 2) a single point bonding using a laser, in the same way as in an ordinary TAB (Tape Automated Bonding) or OLB (Outer Lead Bonding).

Figure 7:
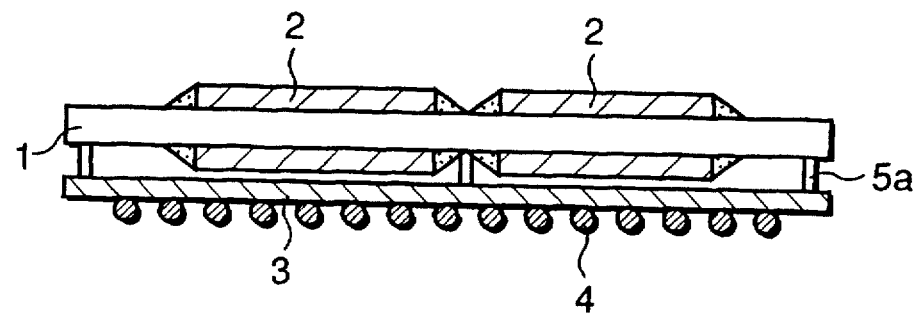
FIG. 7 is a sectional view of a structure of a second embodiment according to the invention.

FIG. 7 shows in a sectional view a structure of a second embodiment according to the invention. This structure is configured such that, unlike the one shown in FIGS. 6A and 6B, the carrier board 3 uses a glass epoxy board, the connection terminal for the MCM board 1 and the carrier board 3 uses a metal pin 5a, and a connection point is provided also between the bare chips 2 on the back surface of the MCM board. Other arrangements in this embodiment are the same as those in the first embodiment.

Figure 8:
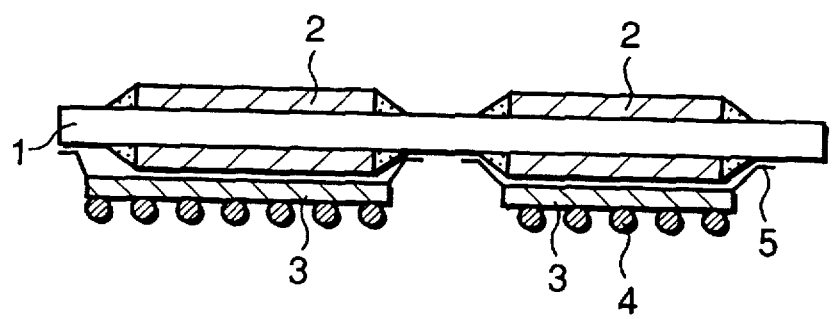
FIG. 8 is a sectional view of a structure of a third embodiment according to the invention.

FIG. 8 shows in a sectional view a structure of a third embodiment according to the invention. The difference in this embodiment from the first embodiment shown in FIGS. 6A and 6B is that the carrier board 3 is divided for each IC. In this way, any defects or failure occurred can be easily analyzed. Other arrangements in this embodiment are the same as those in the first embodiment.

Figure 9:
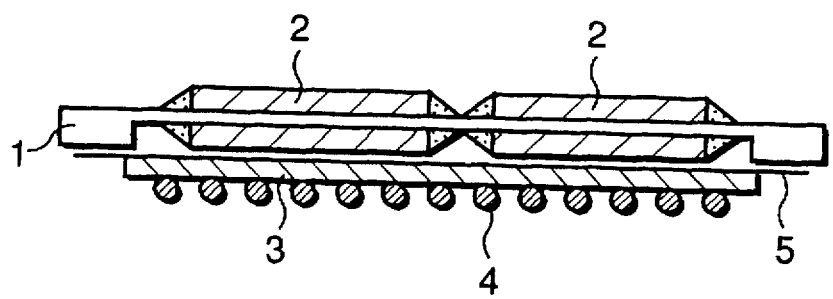
FIG. 9 is a sectional view of a structure of a fourth embodiment according to the invention.

FIG. 9 shows in a sectional view a structure of a fourth embodiment according to the invention. The difference in this embodiment from the first embodiment shown in FIGS. 6A and 6B is that the middle portion of the MCM board 1 is recessed with the depth of the recess being about the same as the thickness of the chips (about 0.3–0.6 mm) so as to accommodate the chips therein. In this way, it is possible to scale down the thickness of the structure. Other arrangements are the same as those in the first embodiment.

Figure 10:
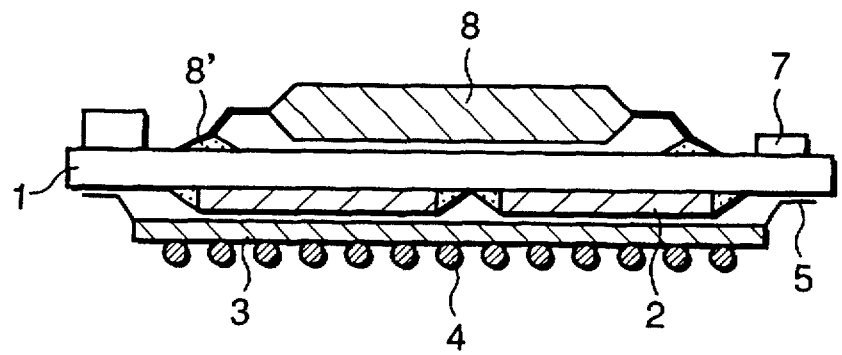
FIG. 10 is a sectional view of a structure of a fifth embodiment according to the invention.

FIG. 10 shows in a sectional view a structure of a fifth embodiment according to the invention. The difference in this embodiment from the first embodiment shown in FIGS.

6A and 6B is that an SMD (Surface Mount Device) 8 is mounted on the front surface of the MCM board 1 through SMD connection pads 8' of the MCM board. Other arrangements are the same as those in the first embodiment.

Figure 11:
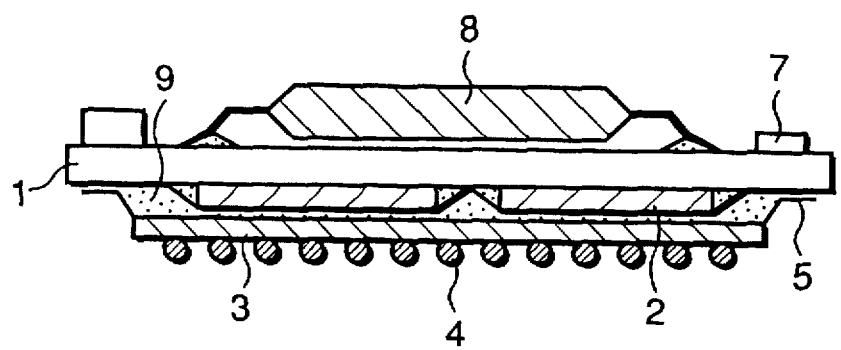
FIG. 11 is a sectional view of a structure of a sixth embodiment according to the invention.

FIG. 11 shows in a sectional view a structure of a sixth embodiment according to the invention. The difference in this embodiment from the first embodiment shown in FIGS. 6A and 6B is that a silicone layer 9 is interposed between the MCM board 1 and the carrier board 3. This enables the cooling of the bare chip. Other arrangements are the same as those in the fifth embodiment.

Figure 12:
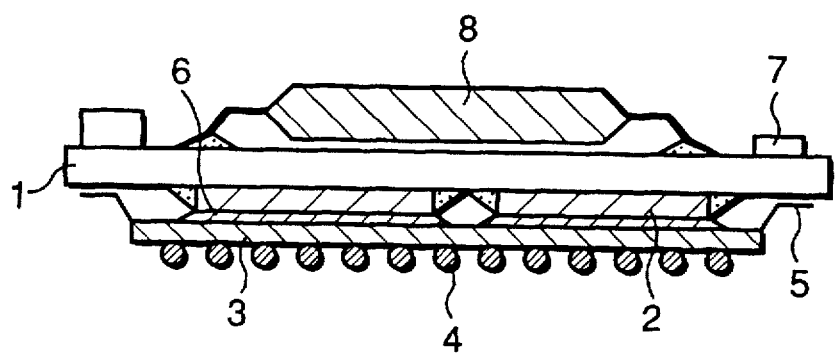
FIG. 12 is a sectional view of a structure of a seventh embodiment according to the invention.

FIG. 12 shows in a sectional view a structure of a seventh embodiment according to the invention. The difference in this embodiment from the first embodiment shown in FIGS. 6A and 6B is that a conductive material 6 is interposed between the bare chip 2 and the carrier board 3 on the back surface of the MCM board 1. This enables the fixing of the chip and the GND connection. Other arrangements are the same as those in the fifth embodiment.

As described above, by changing the pad arrangement at the periphery of the MCM board to a matrix arrangement of a BGA type according to the invention, 1) a dramatic scaling down of the MCM board can be achieved. For example, where four bare chips were mounted on a back surface of the MCM board and a QFP (Quad Flat Package) and an SMD were mounted on a front surface thereof, the size was 32 mm□=1024 mm². However, the application of the present invention enables the reduction of this size to 26 mm□=676 mm² which is a 34% reduction in the area. Thus, 2) the reduction in the mounting area in the mother board results in a significant relaxation in the mounting limitation of other electronic parts. Also, since the spaces between the external connection terminals are made wider as a result of the changing of the arrangement of the MCM board connection terminals to a matrix form of a BGA type, the mounting of parts on the mother board is facilitated whereby 3) high yield and high quality production is ensured. Further, where a carrier board is provided on a function to function basis, 4) it makes it easy to analyze any defects or failure occurred. By filling-in the silicone between the MCM substrate and the carrier substrate, 5) it is possible to effect the cooling of the chip. Also, the interposing of a conductive material between the MCM board and the carrier board provides a GND connection portion, 6) whereby the occurrence of noise is suppressed to a minimum.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. An MCM carrier having wiring layers on front and back surfaces and internally thereof, said MCM carrier comprising:

an MCM board having a plurality of carrier board connection pads at a peripheral portion on the back surface thereof;

at least one first IC chip mounted on the front surface of said MCM board and connected to said wiring layers;

at least one second IC chip mounted on the back surface of said MCM board and connected to said wiring layers; and a carrier board having MCM board connection terminals and external connection terminals in a matrix form, said MCM board connection terminals being connected to said carrier board connection pads of said MCM board so as to extend outward from said MCM board, wherein said external connection terminals are attached to the back surface of said carrier board.

2. The MCM carrier according to claim 1, in which said carrier board connection pads of said MCM board are provided at the peripheral portion of said MCM board and between said IC chips.

3. The MCM carrier according to claim 1, in which said MCM board has a back surface whose middle portion is recessed for accommodating said IC chips within a confine of said recess.

4. An MCM carrier according to claim 1, wherein said external connection terminals are formed at said carrier board with a ball in a ball grid array and said carrier board is formed in one level.

5. The MCM carrier according to claim 1, wherein said connection terminals are metal pins placed along the peripheral portion of the back portion of said MCM carrier and between said second IC chips, and said carrier board is formed of a glass epoxy.

6. An MCM carrier having wiring layers on front and back surfaces and internally thereof, said MCM carrier comprising:

an MCM board having a plurality of carrier board connection pads at a peripheral portion on the back surface thereof;

at least one first IC chip mounted on the front surface of said MCM board and connected to said wiring layers;

at least one second IC chip mounted on the back surface of said MCM board and connected to said wiring layers; and a carrier board having MCM board connection terminals and external connection terminals in a matrix form, said MCM board connection terminals being connected to said carrier board connection pads of said MCM board, in which said carrier board is divided for each of said IC chips.

7. The MCM carrier according to any one of claims 1–4, in which said MCM board has SMD connection pads only on the front surface, and an SMD is mounted through said SMD connection pads.

8. The MCM carrier according to any one of claims 1–4, in which a space between said MCM board and said carrier board is filled with silicone.

9. The MCM carrier according to any one of claims 1–4, in which a space between said IC chips and said carrier board is filled with conductive material.

10. The MCM carrier according to claim 5, in which a space between said MCM board and said carrier board is filled with silicone.

11. The MCM carrier according to claim 5, in which a space between said IC chips and said carrier board is filled with conductive material.

* * * * *